United States Patent [19]

Ishii et al.

[11] Patent Number: 5,475,267

[45] Date of Patent: * Dec. 12, 1995

[54] MULTILAYER INTERCONNECTION STRUCTURE FOR A SEMICONDUCTOR DEVICE

[75] Inventors: Atsushi Ishii; Yoshifumi Takata; Akihiko Ohsaki; Kazuyoshi Maekawa, all of Hyogo, Japan

[73] Assignee: Mitsubishi Denki Kabushiki Kaisha, Tokyo, Japan

[ * ] Notice: The portion of the term of this patent subsequent to May 17, 2011, has been disclaimed.

[21] Appl. No.: 354,737

[22] Filed: Dec. 8, 1994

Related U.S. Application Data

[63] Continuation of Ser. No. 194,603, Feb. 10, 1994, abandoned, which is a continuation of Ser. No. 871,228, Apr. 20, 1992, Pat. No. 5,313,100.

[30] Foreign Application Priority Data

Apr. 26, 1991 [JP] Japan ................................. 3-97088
Nov. 7, 1991 [JP] Japan ................................. 3-291296

[51] Int. Cl.⁶ .................................................. H01L 29/43
[52] U.S. Cl. .......................... 257/752; 257/757; 257/764; 257/763; 257/765; 257/915
[58] Field of Search ................................... 257/763, 915, 257/750, 758–760, 751, 764, 765, 767, 754, 757, 768–770

[56] References Cited

U.S. PATENT DOCUMENTS

| | | | |
|---|---|---|---|
| 4,556,897 | 12/1985 | Yorikane et al. | 257/765 |
| 4,820,611 | 4/1989 | Arnold, III et al. | 437/229 |
| 4,924,295 | 5/1990 | Kuecher | 257/763 |
| 4,980,752 | 12/1990 | Jones, Jr. | 257/763 |
| 5,071,714 | 12/1991 | Rodbell et al. | 257/767 |

FOREIGN PATENT DOCUMENTS

| | | |
|---|---|---|
| 0098582 | 1/1984 | European Pat. Off. . |
| 0276087 | 7/1988 | European Pat. Off. . |
| 3534600 | 4/1987 | Germany . |
| 0118652 | 9/1980 | Japan . |
| 0154048 | 7/1986 | Japan . |
| 0220441 | 9/1986 | Japan . |
| 0132359 | 6/1987 | Japan . |
| 0047951 | 2/1988 | Japan . |

(List continued on next page.)

OTHER PUBLICATIONS

"A Highly Reliable Multilevel Interconnection Process for 0.6 μm CMOS Devices" by Y. Takata et al., 8th Inst. VLSI Multilevel Interconnection Conference, Santa Clara, Calif., U.S.A., Jun. 11, 12, 1991, 7 pages.
Abstract Citation, Rodbell et al., Abstract for "Electromigration Behavior in Layered Ti/AlCu/Ti Films and Its Dependence on Intermetallic Structure.", publication appers in Materials Reliability Issues in Microelectronics Symposium, Mater. Res. Soc. 1991.

Primary Examiner—William Mintel
Assistant Examiner—Peter Toby Brown
Attorney, Agent, or Firm—Lowe, Price, LeBlanc & Becker

[57] ABSTRACT

An aluminum interconnection film has a three layered structure of an aluminum alloy film, a tungsten film, and a titanium nitride film. An aluminum interconnection film and an aluminum interconnection film are electrically connected through a through hole formed in a silicon oxide film, one embodiment using a tungsten plug for the electrical connection. Because light reflectivity of the titanium nitride film is low, the exposed area of the resist can be kept within a predetermined area even if photolithography is carried out above a step where light is irregularly reflected. Therefore, it is possible to form a through hole of a desired dimension even if the through hole is formed above the step. Even if the titanium nitride film is etched and removed in forming the through hole, the aluminum alloy film is not exposed since the etching speed of the silicon oxide film is considerably slower than that of the tungsten film. The problem of denatured layer formation and residue formation caused by exposure of aluminum alloy film does not occur.

22 Claims, 13 Drawing Sheets

OTHER PUBLICATIONS

| | | |
|---|---|---|
| 0229852 | 9/1988 | Japan . |
| 0289935 | 11/1988 | Japan . |
| 0044047 | 2/1989 | Japan . |
| 0080065 | 3/1989 | Japan . |
| 0202841 | 8/1989 | Japan . |
| 0196142 | 8/1989 | Japan . |
| 0012859 | 1/1990 | Japan . |
| 0015633 | 1/1990 | Japan . |
| 0264433 | 10/1990 | Japan . |
| 0312235 | 12/1990 | Japan . |

MULTILAYER INTERCONNECTION STRUCTURE FOR A SEMICONDUCTOR DEVICE

This application is a continuation of application Ser. No. 08/194,603 filed Feb. 10, 1994, now abandoned, which is a continuation of application Ser. No. 07/871,228 filed Apr. 20, 1992, now U.S. Pat. No. 5,313,100.

BACKGROUND OF THE INVENTION

1. Field of the Invention

The present invention relates to an interconnection structure of semiconductor devices, and more particularly to the interconnection structure of a semiconductor device having each of multilayer interconnection layers connected through a connection hole, and a method of manufacturing thereof.

2. Description of the Background Art

Aluminum films and aluminum alloy films of low resistivity are widely used as the interconnection of semiconductor devices. Recently, interconnections of multilayer structure having refractory metals such as tungsten (W), titanium nitride (TiN), molybdenum silicide (MoSi) formed on aluminum films and aluminum alloy films are used for the purpose of improving tolerance for stress migration and electromigration. Stress migration is a phenomenon where the interconnection is discontinued due to film stress of interlayer insulting films and the like formed on the interconnection. Electromigration is a phenomenon where metal atoms migrate under high current density to generate local voids, resulting in increase in resistance and disconnection in the interconnection.

Among the above-mentioned refractory metals, titanium nitride is widely used because of its low light reflectivity. The reason why lower light reflectivity is preferable will be explained with reference to FIGS. 22–25.

Referring to FIG. 22, a field oxide film 3 and a silicon oxide film 5 are formed on a silicon substrate 1. An aluminum interconnection film 7 is formed on silicon oxide film 5. A refractory metal film 9 having relatively high light reflectivity is formed on aluminum interconnection film 7. A silicon oxide film 11 is formed on refractory metal film 9. A resist 13 is formed on silicon oxide film 11.

It is necessary to form a through hole in silicon oxide film 11 in order to electrically connect aluminum interconnection film 7 and another aluminum interconnection film than will be formed later on silicon oxide film 11. Resist 13 is exposed using a mask 15 for the purpose of forming this through hole. Reference number 17 denotes a light transmission blocking portion for blocking the transmission of light. Reference number 19 denotes a light transmission portion that transmits light. Because a through hole is to be formed over a step 6 in aluminum interconnection film 7, the portion of resist 3 above step 6 of aluminum interconnection film 7 is exposed. A portion of light reaches refractory metal film 9 since resist 13 and silicon oxide film 11 have the nature of transmitting light. Light reaches the area in refractory metal 9 comprising a step to be reflected irregularly. This light of irregular reflection exposes resist 13 beneath light transmission blocking portion 17.

FIG. 23 shows the state after exposure, where 21 is the exposed portion of resist 13. Because refractory metal film 9 has high light reflectivity, not only the portion of resist 13 beneath light transmission portion 19, but also some portion of resist 13 beneath light transmission blocking portion 17 is exposed.

Referring to FIG. 24, the exposed portion of resist 13 is removed. The remaining resist 13 is used as a mask to etch silicon oxide film 11 for forming a through hole 23.

Referring to FIG. 25, resist 13 is removed and an aluminum interconnection film 25 is formed on silicon oxide film 11. Aluminum interconnection film 25 is applied the predetermined patterning. This completes the electrical connection between aluminum interconnection film 25 and aluminum interconnection film 7. Because the exposed portion of the resist has been enlarged due to irregular reflection of light, the dimension of through hole 23 is not the designed dimension W1, but dimension W2. Dimension W3 of aluminum interconnection film 25 is made larger than W1 taking into consideration the offset of the mask. However, aluminum interconnection film 7 is also etched at the time of patterning aluminum interconnection film 25 since the dimension of the through hole has become W2.

This explains why titanium nitride of low light reflectivity is widely used as refractory metal film 9. Because the light reflectivity of titanium nitride is low, the portion of resist 13 beneath light transmission blocking portion 17 will not be exposed, as in FIG. 23.

The technique of forming titanium nitride on an aluminum interconnection is disclosed in Japanese Patent Laying-Open No. 63-289935 (1988).

It has been described above that high light reflectivity of refractory metal film 9 is responsible for the dimension of through hole 13 to become larger than the design value. The same thing can be said in patterning the area in aluminum interconnection film 7 comprising the step on which refractory metal film 9 is formed. The dimension of aluminum interconnection film 7 at the step differs from the design value.

The method of electrically connecting a lower layer aluminum interconnection film and an upper layer aluminum interconnection film using titanium nitride as the refractory method will be explained hereinafter with reference to FIGS. 17–21.

Referring to FIG. 17, impurity regions 43 and 45having a distance therebetween are formed in the proximity of the main surface of a silicon substrate 27. A gate electrode 47 is formed through a gate oxide layer (not shown) on the main surface of silicon substrate 27 between impurity regions 43 and 45. Gate electrode 47 has a multilayer structure formed of a polysilicon film 39 and a tungsten silicide film 37. Reference number 41 denotes a sidewall insulating film. Gate electrode 47, impurity regions 43, 45 and silicon substrate 27 implement a MOS (Metal Oxide Semiconductor) field effect transistor.

At the main surface of silicon substrate 27, a field oxide film 29 is formed surrounding this MOS field effect transistor. A silicon oxide film 31 is formed over field oxide film 29 and gate electrode 47. An aluminum interconnection film 49 formed of an aluminum alloy film 33 and a titanium nitride film 35 is provided on silicon oxide film 31.

Referring to FIG. 18, a silicon oxide film 51, and a resist 53 are formed in sequence all over the main surface of silicon substrate 27. In forming silicon oxide film 51, a phenomenon called side hillock occurs when silicon is included in aluminum alloy film 33. This hillock phenomenon is seen in FIG. 18 where hillocks 63 are generated in the sidewalls of aluminum alloy film 33. Side hillocks 63 are generated due to heat occurring in the formation of silicon oxide film 51. The generation of side hillock 63 causes electrical connection between interconnections which should actually be separated, resulting in decrease in yield and reliability.

Resist 53 is exposed to remove a desired portion of resist 53. Then, using resist 53 as a mask, silicon oxide film 51 is subjected to reactive ion etching using $CHF_3$ gas or $CF_4$ type gas to form a through hole 55, as shown in FIG. 19.

Since the difference of the etching speeds of the titanium nitride film and the silicon oxide film is small, titanium nitride film 35 is removed by this etching to expose the surface of aluminum alloy film 33. If aluminum alloy film 33 is exposed, the surface layer of aluminum alloy film 33 will be etched. The etched Al and the etching gas are reacted to form a residue 59 at the sidewall of through hole 55. Residue 59 is a compound of Al, F and C.

Referring to FIG. 20, resist 53 is removed by ashing, but residue 59 remains due to its low volatility. It is therefore necessary to remove residue 59 by carrying out wet process of rinsing and with an organic type releasing solution and the like. A denatured layer 57 is generated during this process if aluminum alloy film 33 is exposed due to the high reaction of aluminum alloy. There are some cases where residue 59 is not completely removed so that residue 59 and denatured layer 57 exist at the same time.

Referring to FIG. 21, an aluminum interconnection film 61 is formed on silicon oxide film 51 to be patterned.

If there is residue 59 left in the sidewall of through hole 55, aluminum may not be introduced adequately into through hole 55, leading to a possibility that the electrical connection between aluminum interconnection films 49 and 61 is defective. This will degrade the yield and reliability of the semiconductor device.

There is also a problem that the electrical connection between aluminum interconnection films 61 and 49 may be defective if the amount of denatured layer 57 formed is appreciable since denatured layer 57 is an insulator. This will also degrade the yield and reliability of the semiconductor device.

An approach to increase the film thickness of titanium nitride 35 may be considered for preventing exposure of aluminum alloy film 33 by etching. However, this approach is contrary to obtain the lowest light reflectivity, since the reflectivity is at its minimum only at a certain thickness. The thickness of titanium nitride film 35 cannot be increased also from the standpoint of planarity.

Formation of a tungsten film on the titanium nitride film can prevent the titanium nitride film from being etched and removed even if it is thin. This is because the etching selectivity ratio of tungsten film to silicon oxide film is great. This art is disclosed in Japanese Patent Laying-Open No. 62-132359 (1987). However, the exposure portion of the resist will be enlarged to result in a through hole larger than the design value, as described above, since tungsten has a high light reflectivity.

SUMMARY OF THE INVENTION

In view of the foregoing, an object of the present invention is to provide an interconnection structure of a semiconductor device allowing the formation of a through hole of a desired dimension with reliable contact therein.

Another object of the present invention is to provide an interconnection structure of a semiconductor device allowing formation of a through hole of a desired dimension with reliable contact therein, in a semiconductor device having a step in a lower interconnection and a through hole over the step.

A further object of the present invention is to provide an interconnection structure of a semiconductor device that can prevent exposure of a layer of a main portion of a lower interconnection even when there is great difference in depths between a first through hole and a second through hole.

A still further object of the present invention is to provide an interconnection structure of a semiconductor device that can have the intensity of light reflecting at a lower interconnection kept constant.

Yet another object of the present invention is to provide an interconnection structure of a semiconductor device that can have the generation of a side hillock prevented.

An additional object of the present invention is to provide a method of manufacturing an interconnection structure of a semiconductor device allowing formation of a through hole of a desired dimension with reliable contact in the through hole.

An interconnection structure of a semiconductor device according to the present invention includes a first interconnection layer, an insulating layer formed on the first interconnection layer having a through hole reaching the surface of the first interconnection layer, and a second interconnection layer formed on the insulating layer electrically connected to the first interconnection layer through the through hole. The first interconnection layer includes a first conductive layer containing metal, a second conductive layer formed on the first conductive layer, and a third conductive layer formed on the second conductive layer. Under the etching conditions of the insulating layer, the etching speed of the second conductive layer is slower than that of the third conductive layer. The light reflectivity of the third conductive layer is lower than that of the second conductive layer.

A method of manufacturing an interconnection structure of a semiconductor device according to the present invention includes the steps of forming a first conductive layer containing metal, a second conductive layer, and a third conductive layer in sequence on the main surface of a substrate. An insulating layer is formed on a first interconnection layer including first, second and third conductive layers. Under the etching conditions of the insulating layer, the etching speed of the second conductive layer is made slower than that of the third conductive layer. The light reflectivity of the third conductive layer is made lower than that of the second conductive layer. Then, a resist is formed on the insulating layer. The resist is patterned to a predetermined configuration by photolithography. Using the resist as a mask, the insulating layer is selectively etched to form a through hole. A second interconnection layer is formed on the insulating layer to connect the first and second interconnection layers through the through hole.

Because the etching speed of the second conductive layer is slower than that of the third conductive layer under the etching conditions of the insulating layer, the exposure of the first conductive layer can be prevented due to the presence of the second conductive layer even if the third conductive layer is etched and removed, in etching a portion of the insulating layer to form a through hole.

Because the third conductive layer may be etched and removed, it is possible to select a material having low light reflectivity for the third conductive layer. It is also possible to establish the thickness of the third conductive layer to have the lowest light reflectivity.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
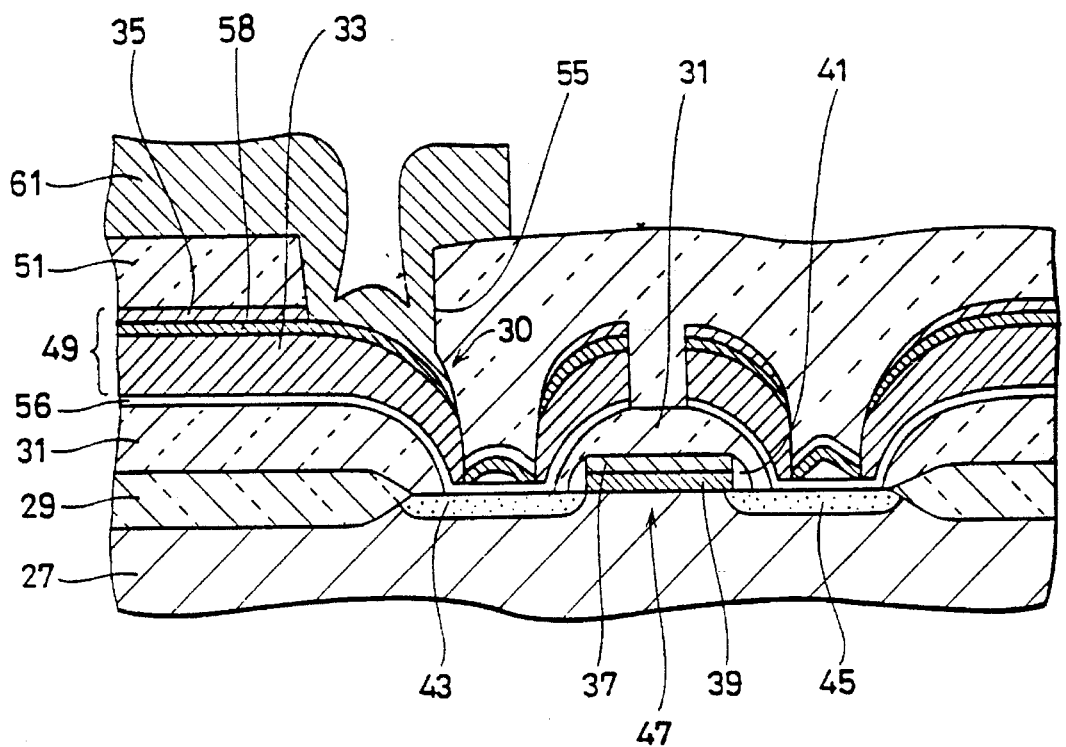
FIG. 1 is a sectional view of a semiconductor device showing a first embodiment of an interconnection structure of a semiconductor device according to the present invention.

FIG. 1 is a sectional view showing a first embodiment of an interconnection structure of a semiconductor device according to the present invention. Impurity regions 43 and 45 having a distance therebetween are formed in the proximity of the main surface of a silicon substrate 27. The substrate may be formed of Ge, GaAs, InP, SiC, etc. A gate electrode 47 is formed on the main surface of silicon substrate 27 between impurity regions 43 and 45. Gate electrode 47 has a multilayer structure formed of a polysilicon film 39 of 0.2 μm thickness and a tungsten silicide film 37 of 0.2 μm thickness. Impurity regions 43 and 45, gate electrode 47 and silicon substrate 27 implement a MOS field effect transistor. Reference number 41 denotes a sidewall insulating film.

A field oxide film 29 of 0.5 μm thickness is formed at the main surface of silicon substrate 27 surrounding the MOS field effect transistor. A silicon oxide film 31 of 1.0 μm thickness is formed over field oxide film 29 and the MOS field effect transistor. A barrier metal 56 of 0.1 μm thickness is formed on silicon oxide film 31.

An aluminum interconnection film 49 is formed on barrier metal 56. Aluminum interconnection film 49 has a multilayer structure of an aluminum alloy film 33, a tungsten film 58 and a titanium nitride film 35. Aluminum alloy film 33 has a thickness of 0.4 μm containing copper. The aluminum alloy film may be replaced by aluminum film or copper film. The thicknesses of tungsten film 58 and titanium nitride film 35 are 0.1 μm and 0.03 μm, respectively.

A silicon oxide film 51 of 1.0 μm thickness is formed on aluminum interconnection film 49. An aluminum interconnection film 61 of 1.0 μm thickness containing copper is formed on silicon oxide film 51. Aluminum interconnection film 49 and aluminum interconnection film 61 are electrically connected by a through hole 55. Through hole 55 is located above a step 30. Titanium nitride film 35 is not seen within through hole 55 since it has been etched and removed in forming through hole 55.

The manufacturing steps of the first embodiment of the interconnection structure of the semiconductor device according to the present invention will be explained hereinafter with reference to FIGS. 2–7.

Figure 2:
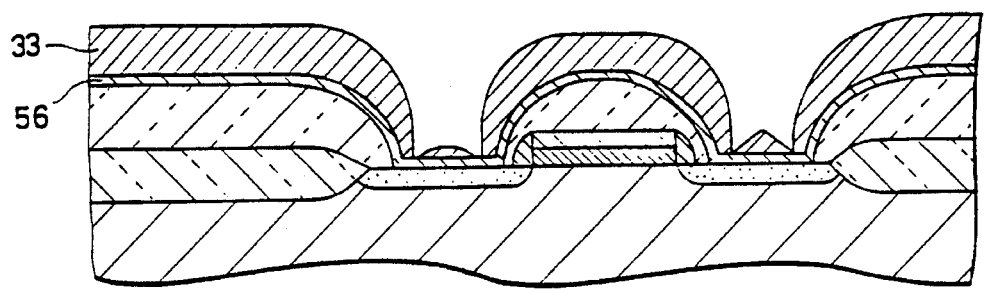
FIG. 2 is a sectional view of the semiconductor device of FIG. 1 showing the first step of the manufacturing steps thereof.

Referring to FIG. 2, aluminum alloy film 33 is formed by sputtering on barrier metal 56.

Figure 3:
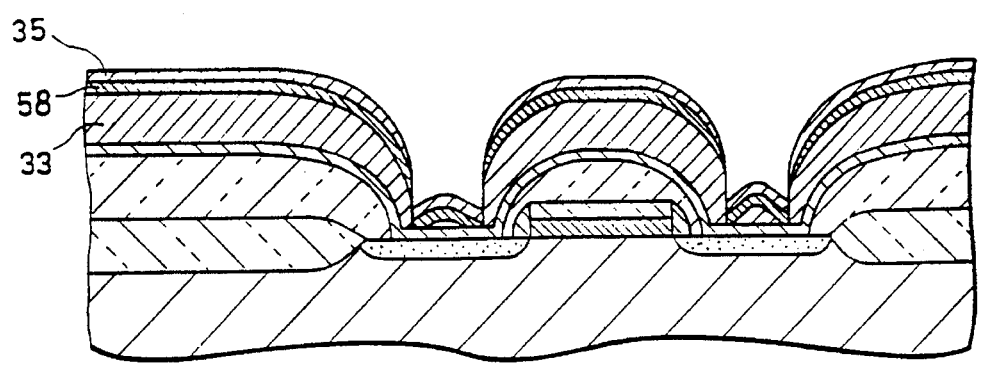
FIG. 3 is a sectional view of the semiconductor device of FIG. 1 showing the second step of the manufacturing steps thereof.

Referring to FIG. 3, tungsten film 58 and titanium nitride film 35 are formed by sputtering in sequence on aluminum alloy film 33.

Figure 4:
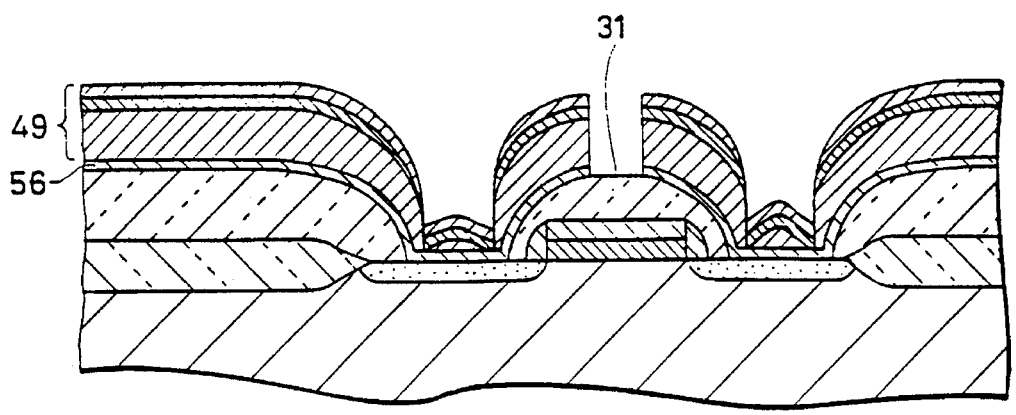
FIG. 4 is a sectional view of the semiconductor device of FIG. 1 showing the third step of the manufacturing steps thereof.

Referring to FIG. 4, the layers of aluminum interconnection film 49 and barrier metal 56 are separated above silicon oxide film 31 using reactive ion etching.

Figure 5:
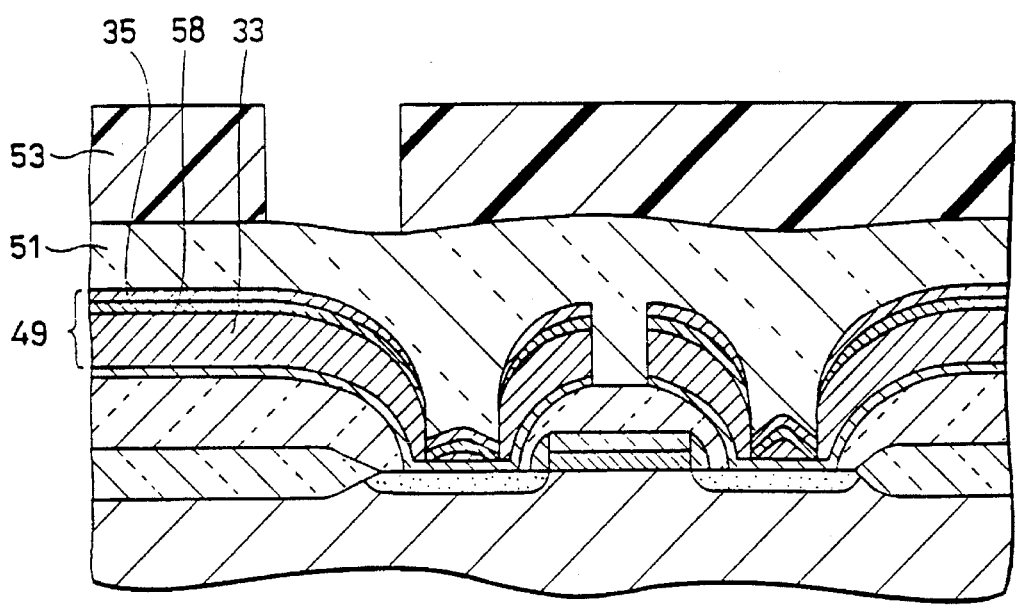
FIG. 5 is a sectional view of the semiconductor device of FIG. 1 showing the fourth step of the manufacturing steps thereof.

Referring to FIG. 5, silicon oxide film 51 is formed using plasma CVD (Chemical Vapor Deposition) method. A side hillock is not generated since silicon is not included in aluminum alloy film 33 of the first embodiment. The silicon oxide film may be formed using atmospheric pressure CVD. Alternatively, a coating insulating film (spin on glass, for example) may be formed instead of the silicon oxide film.

Referring to FIG. 5, resist 53 is formed on silicon oxide film 51. A portion of resist 53 above the area where a through hole is to be formed is exposed. Because titanium nitride film 35 is used as the top layer of aluminum interconnection film 49 in the first embodiment, the reflectance of light can be prevented during exposure process to keep the dimension error of the exposed resist 53 within the allowable range.

Figure 10:
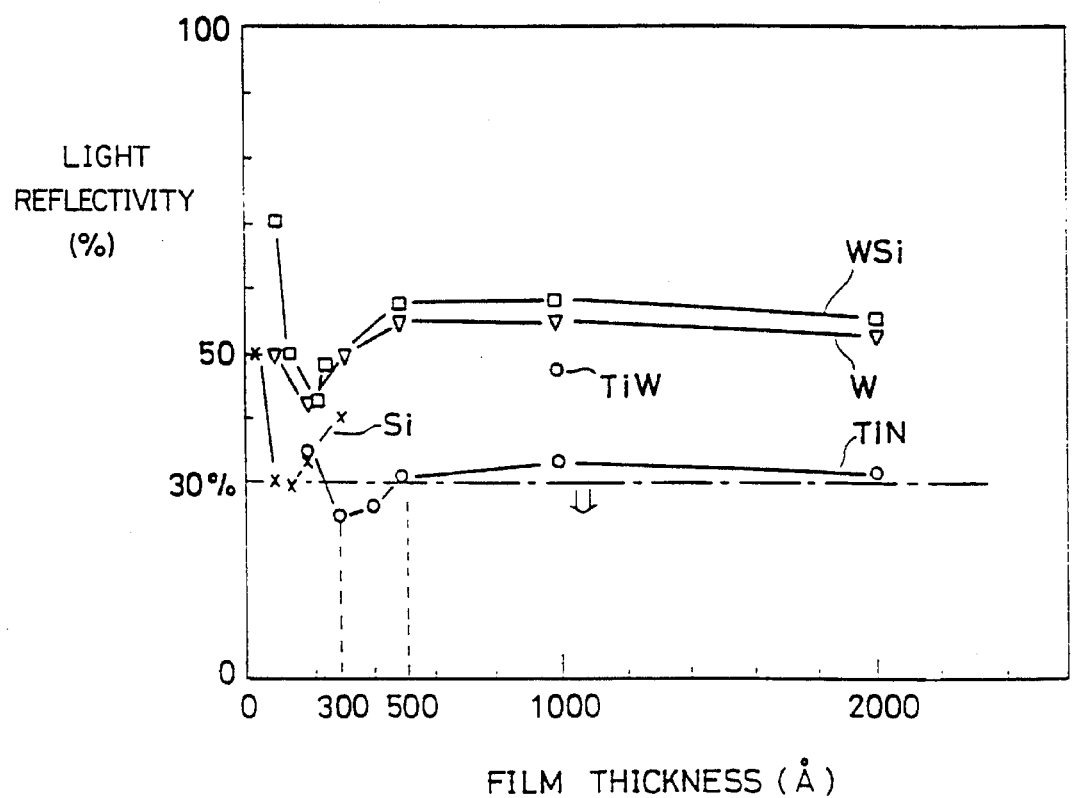
FIG. 10 is a graph showing the relation between film thickness and reflectivity of various materials.

FIG. 10 is a graph showing the relation between film thickness and light reflectivity of various materials. Light is directed into aluminum and adjusted so that the intensity of the reflected light is equal to that of the incident light. Under the condition that this light reflectivity of aluminum is 100%, light is directed to a specimen and the intensity of the reflected light measured. This measured value (%) indicates the ratio of reflectivity with respect to aluminum.

FIG. 10 shows that the reflectivity of titanium nitride is around the value of 30%. Tungsten silicide, tungsten, and titanium tungsten respectively indicate values of around 50%. It has been found out that the dimension error of through holes and interconnection patterns are within the allowable value range if the light reflectivity of the top film layer of aluminum interconnection film 49 is less than or equal to 35%. Therefore, titanium nitride film is preferable for the top layer film of aluminum interconnection film 49. Although light reflectivity of silicon indicates a value of 30% in the vicinity of 100 Å, silicon is not suitable for the present invention. If silicon is used instead of titanium nitride, silicon will combine with the underlying tungsten during the heating process to form tungsten silicide. Tungsten silicide has high light reflectivity, as shown in FIG. 10.

The preferable film thickness of titanium nitride is 300–500 Å since the reflectivity of titanium nitride shows a value of less than 30% when the film thickness thereof is 300–500 Å. The present invention is not limited to the usage of titanium nitride film 35 as the top layer film for aluminum interconnection 49 in the first embodiment. Any material having reflectivity less than that of the second conductive layer may be used.

Figure 6:
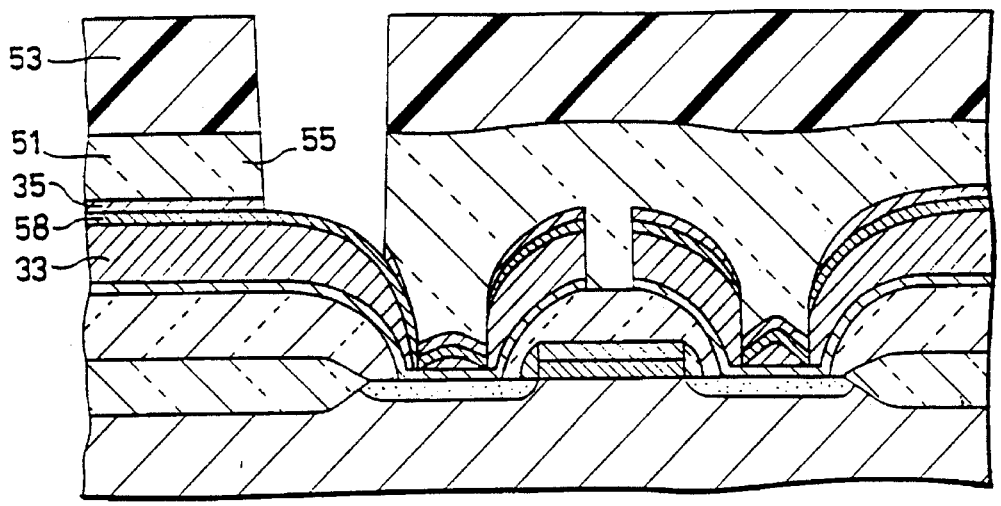
FIG. 6 is a sectional view of the semiconductor device of FIG. 1 showing the fifth step of the manufacturing steps thereof.

Referring to FIG. 6, silicon oxide film 51 is subjected to reactive ion etching with $CHF_3/O_2$ or $CF_4/O_2$ type gas using resist 53 as a mask to form through hole 55.

The following Table 1 shows the etching selectivity ratio of various materials to plasma oxide film.

TABLE 1

| (At Through hole Process: Etching Gas $CHF_3/O_2$) | |
|---|---|
| Material | Etching Speed |
| Plasma Oxide Film | 1 |
| W | 1/15 |
| WSi | 1/7 |
| MoSi | 1/7 |
| TiN | 1/2 |
| AlCu | 1/15 |

Table 1 shows the etching speed of each material with 1 as the etching speed of the plasma oxide film. It can be appreciated from Table 1 that titanium nitride will be etched and removed in the formation of a through hole since the etching speed of titanium nitride is ½. On the contrary, the etching speed of tungsten is 1/15 and will not be removed. Therefore, exposure of aluminum alloy film 33 can be prevented. As a result, generation of a denatured layer and a residue can be prevented. Because the object of the present invention can be achieved with a film having an etching speed that is lower than that of titanium nitride, tungsten, tungsten silicide, and molybdenum silicide have applicability to the present invention. Any material is applicable to the present invention as long as its etching speed is slower than that of titanium nitride, and denatured layers and residues are not formed by etching.

The etching speed is varied depending on the type of the insulating film to be etched and the type of etching gas. Therefore, it is necessary to change the material of the film formed on the aluminum alloy film according to the types of the insulating film and etching gas.

Figure 8:
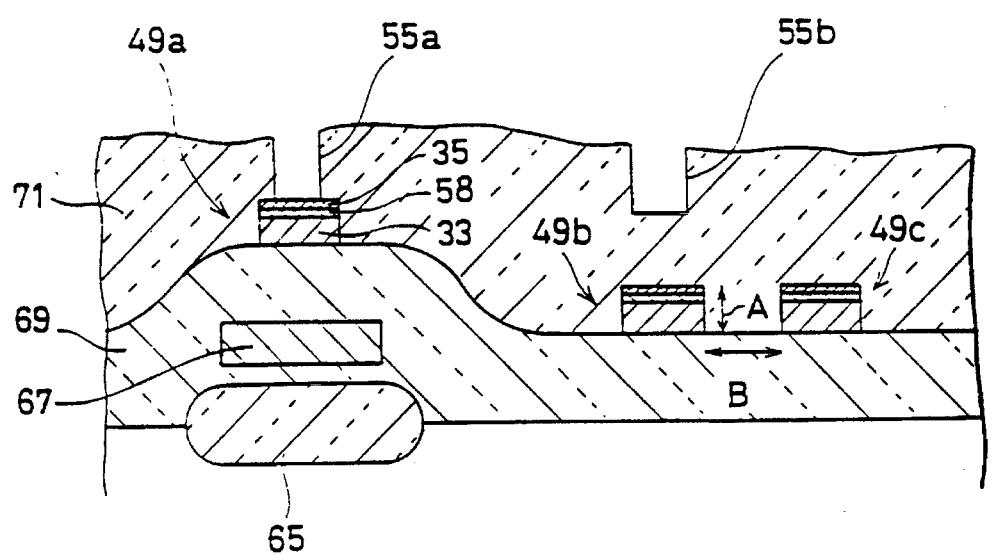
FIG. 8 is a first model diagram for explaining that the film to be formed beneath titanium nitride film 35 preferably has an etching speed that is at most 1/10 of that of the plasma oxide film under the etching conditions of the plasma oxide film.
Figure 9:
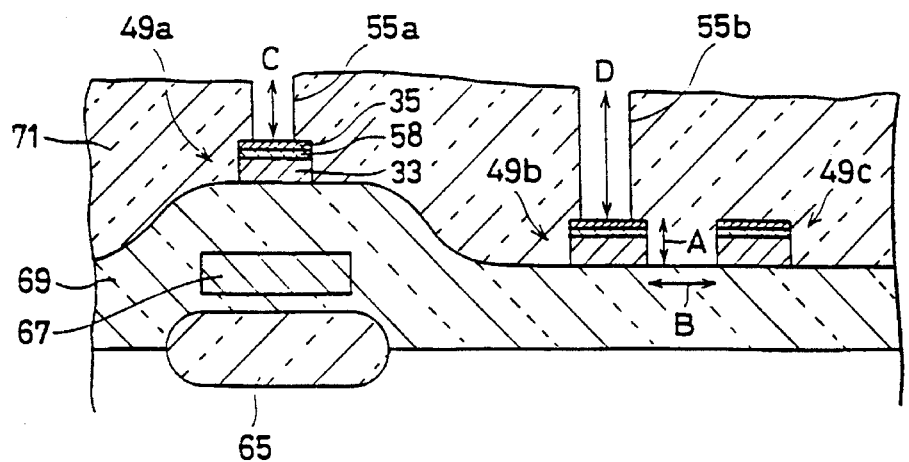
FIG. 9 is a second model diagram of a semiconductor device for explaining that the film to be formed beneath titanium nitride film 35 preferably has an etching speed that is at most 1/10 of the etching speed of the plasma oxide film under the etching conditions of the plasma oxide film.

The fact that a more preferable etching speed of at most 1/10 will be explained with reference to FIGS. 8 and 9 showing sectional views of a semiconductor device. FIG. 8 shows one during the etching process, and FIG. 9 shows one after the etching procedure. Reference number 65 denotes a field oxide film. An interconnection layer 67 is formed on field oxide film 65. A first interlayer insulating film 69 is formed all over the surface of a silicon substrate. Aluminum interconnection films 49a, 49b, and 49c are formed with distances therebetween on first interlayer insulating film 69. Reference number 71 denotes a second interlayer insulating film. A through hole 55a is formed above aluminum interconnection film 49a. A through hole 55b is formed above aluminum interconnection film 49b.

Because of the effect of interconnection layer 67 and field oxide film 65, the difference in depths is often more than 1 μm between depth D of through hole 55b and depth C of through hole 55a. It is not preferable to grow tungsten film 58 to 1000 Å or more. It has been experienced that a void is more likely to be formed in second interlayer insulating film 71 at the time of second interlayer insulating film 71 formation if the aspect ratio (A/B) in spacing between the interconnections is increased. Since the thickness of aluminum alloy film 33 cannot be reduced from the standpoint of conductivity, the thickness of tungsten film 58 is preferably 1000 Å and below.

The value of D–C becomes ten times that of the thickness of tungsten film 58, so that a material having an etching speed of not more than 1/10 is preferable.

The amount of exposure of the resist is determined according to the intensity of the incident light and the intensity of the reflected light. The intensity of the reflected light is regarded as the sum of the intensity of light reflecting from aluminum alloy film 33, from tungsten film 58, and from titanium nitride film 35. A stable light reflectivity is required in order to keep the intensity of the reflected light constant. It is appreciated from FIG. 10 that tungsten has a stable light reflectivity with a film thickness of more than 500 Å. Therefore, the preferable film thickness of the tungsten film is 500 Å and above. Because the value of D–C is at least 1 μm, as described above, second interlayer insulating film 71 is etched more than 1 μm to form a through hole 55b after the formation of the through hole 55a. It is necessary to have a tungsten film 58 of 1 μm/15 thickness, i.e. at least approximately 660 Å in order to prevent exposure of aluminum alloy film 33 of aluminum interconnection layer film 49a at the time of formation of through hole 55b. Titanium nitride film 35 is not regarded. Therefore, it is necessary to have a tungsten film 58 of at least 500 Å thickness considering titanium nitride film 35. This also applies to a tungsten silicide film used as a substitute for a tungsten film.

Figure 7:
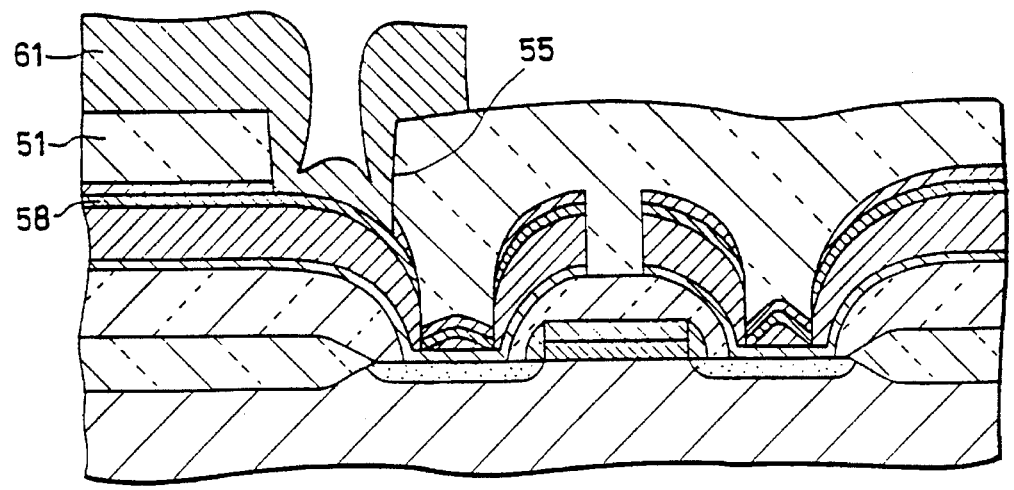
FIG. 7 is a sectional view of the semiconductor device of FIG. 1 showing the sixth step of the manufacturing steps thereof.

Referring to FIG. 7, resist 53 on silicon oxide film 51 is removed. Aluminum interconnection film 61 is formed on silicon oxide film 51 by the sputtering method. Aluminum interconnection film 61 has contact with tungsten film 58 through hole 53. Then, aluminum interconnection film 61 is subjected to a predetermined patterning. This completes the manufacturing steps of the first embodiment of the interconnection structure of the semiconductor device of the present invention. Although through hole 55 is formed over step 30 in the present embodiment, the bottom of through hole 55 may be planar.

Figure 11:
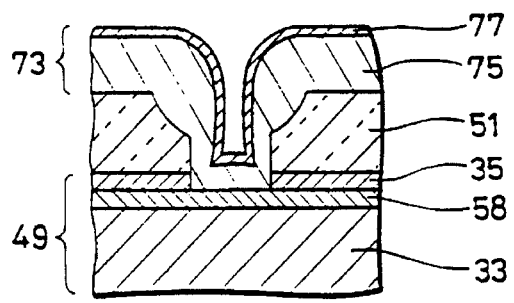
FIG. 11 is a sectional view of an interconnection structure of a second embodiment of an interconnection structure of a semiconductor device according to the present invention.

FIG. 11 is a sectional view showing a second embodiment of an interconnection structure of a semiconductor device according to the present invention. Aluminum interconnection film 49 and aluminum interconnection film 73 located thereabove are electrically connected through a through hole. Aluminum interconnection film 73 has a multilayer structure of aluminum alloy film 75 and titanium nitride film 77. Because aluminum interconnection film 73 is the top layer, etching is not carried out above aluminum interconnection film 73. Therefore, it is not necessary to form a tungsten film on aluminum interconnection film 73. Titanium nitride film 77 is required because exposure is carried out in patterning aluminum interconnection film 73.

Titanium nitride film 77 is preferably removed after the patterning of aluminum interconnection film 73. This is because wire bonding of aluminum is higher in reliability than titanium nitride.

Figure 12:
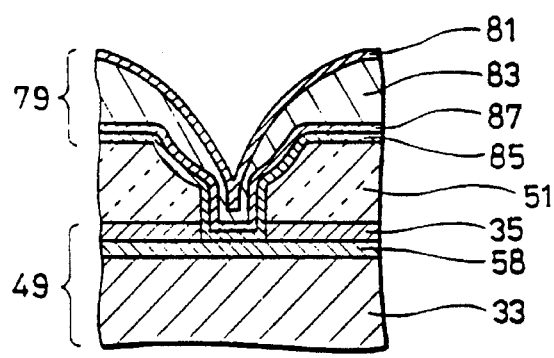
FIG. 12 is a sectional view of an interconnection structure showing a third embodiment of an interconnection structure of a semiconductor device according to the present invention.

FIG. 12 is a sectional view showing a third embodiment of an interconnection structure of a semiconductor device according to the present invention. Aluminum interconnection film 79 has a multilayer structure of titanium film 85, titanium nitride film 87, aluminum alloy film 83 and titanium nitride film 81. Such a structure can improve adherence between aluminum interconnection film 49 and aluminum interconnection film 79 since tungsten film 58 and titanium film 85, titanium film 85 and titanium nitride film 87, titanium nitride film 87 and aluminum alloy film 83 have superior intimacy.

Figure 13:
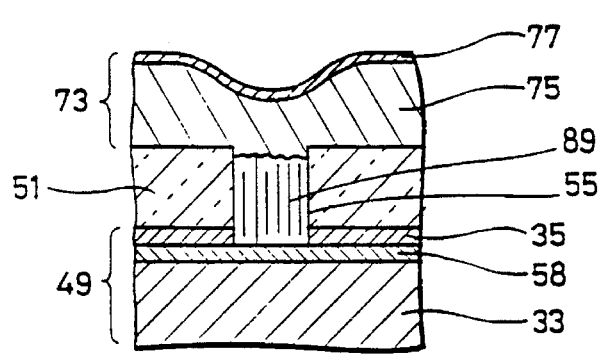
FIG. 13 is a sectional view of an interconnection structure showing a fourth embodiment of an interconnection structure of a semiconductor device according to the present invention.

FIG. 13 is a sectional view showing a fourth embodiment of an interconnection structure of a semiconductor device according to the present invention. Aluminum interconnection films 73 and 49 are electrically connected by a tungsten 89 formed in through hole 55. The dimension of through hole 55 is minimized according to miniaturization of semiconductor devices. If the dimension of through hole 55 becomes smaller than a predetermined value, aluminum cannot be formed within through hole 55 by sputtering. In this case, metal selective CVD method is used. By employing this method to form tungsten 89 in through hole 55, adherence is not degraded because tungsten 89 and tungsten film 58 are of the same type. It is also possible to reduce resistance in the contact since foreign metal compounds are not generated.

Figure 14:
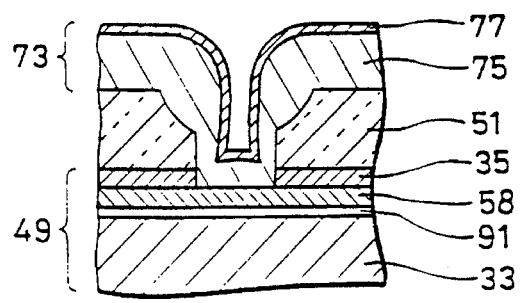
FIG. 14 is a sectional view of an interconnection structure showing a fifth embodiment of an interconnection structure of a semiconductor device according to the present invention.

FIG. 14 is a sectional view of an interconnection structure of a semiconductor device according to a fifth embodiment of the present invention. The difference from the second embodiment of FIG. 11 is that an $Al_2O_3$ film 91 is formed between aluminum alloy film 33 and tungsten film 58. $Al_2O_3$ film 91 is formed by exposing aluminum alloy film 33 to the atmosphere.

Aluminum alloy easily reacts with tungsten, to form a layer of high resistance. $Al_2O_3$ film 91 is formed between aluminum alloy film 33 and tungsten film 58 in the fifth embodiment, so that a layer of high resistance will not be generated.

The reaction of aluminum alloy with tungsten being suppressed by the presence of $Al_2O_3$ between aluminum alloy and tungsten will be described hereinafter according to experimental results. Sample 1 has a tungsten film formed after aluminum alloy is formed. $Al_2O_3$ does not exist between the interface of aluminum alloy and tungsten in sample 1. Four of sample 1 were prepared. Sample 2 has aluminum alloy formed, followed by exposure to the atmosphere, and formation of a tungsten film. $Al_2O_3$ exists at the interface of aluminum alloy and tungsten. Three of sample 2 were prepared.

Figure 15:
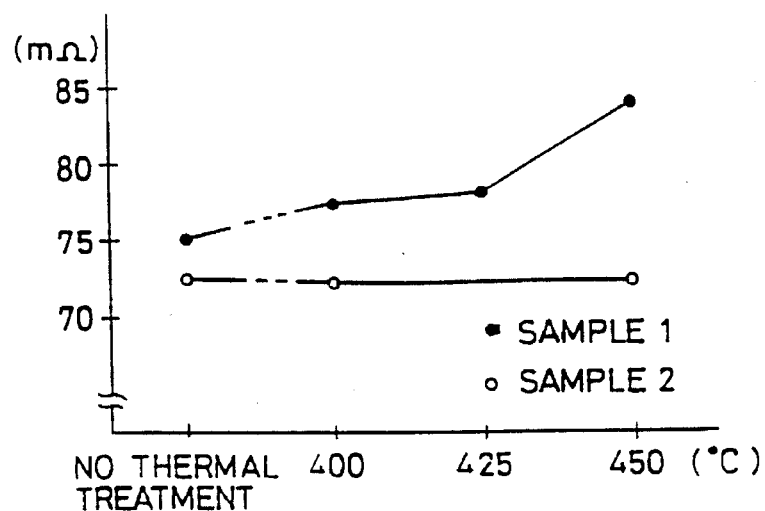
FIG. 15 is a graph showing the relationship between the thermal processing temperature and resistance of a sample having W formed above Al.

One sample 1 was not treated to thermal process, and the resistance measured. Another sample 1 was treated to thermal process for ten hours at 400° C., and had the resistance measured. Still another sample 1 was treated to thermal process for ten hours at 425° C., and had the resistance measured. Yet another sample 1 was treated to thermal process for ten hours at 450° C., and had the resistance measured. Sample 2 was subjected to the same conditions. However, the resistance was not measured after being thermal treated for ten hours at 425° C. The thermal process was all carried out under $N_2$ atmosphere. The results are shown in FIG. 15.

The resistance in sample 1 increases, but not in sample 2. It is therefore understood that a layer of high resistance is not formed in sample 2.

Three of sample 1 were newly prepared. One sample 1 was thermal treated for thirty minutes at 450° C. Another sample 1 was thermal treated for three hours at 450° C. A further sample 1 was thermal treated for ten hours at 450° C. One sample 2 was newly prepared. This sample 2 was thermal treated for ten hours at 450° C.

The samples of 1 and 2 were etched by sputtering, whereby the numbers of Al and W per second were measured. Because the upper layer is W and the lower layer is Al, the subject to be etched proceeds from W to Al in the elapse of time. The results are shown in FIG. 16.

Figure 16:
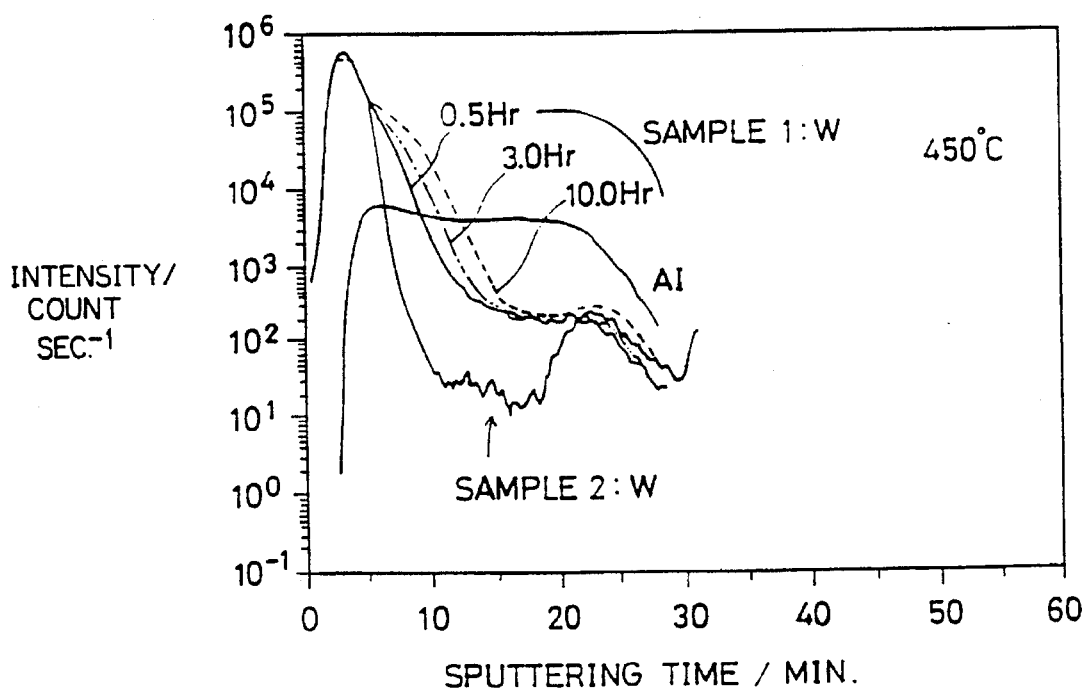
FIG. 16 is a graph showing the relationship between the sputter etching time and the counting numbers of Al and W of a sample having W formed above Al.
Figure 17:
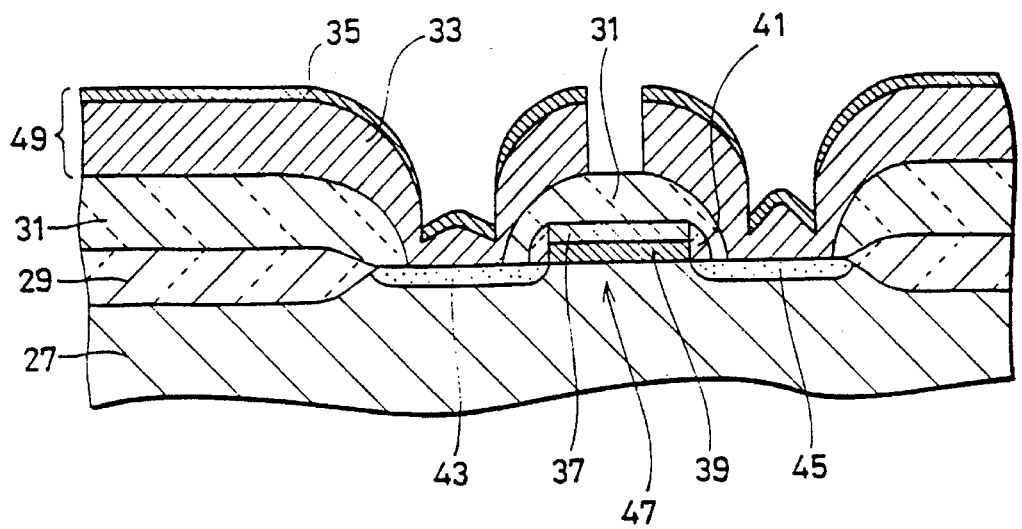
FIG. 17 is a sectional view of a conventional semiconductor device showing the first step of the manufacturing steps thereof.
Figure 18:
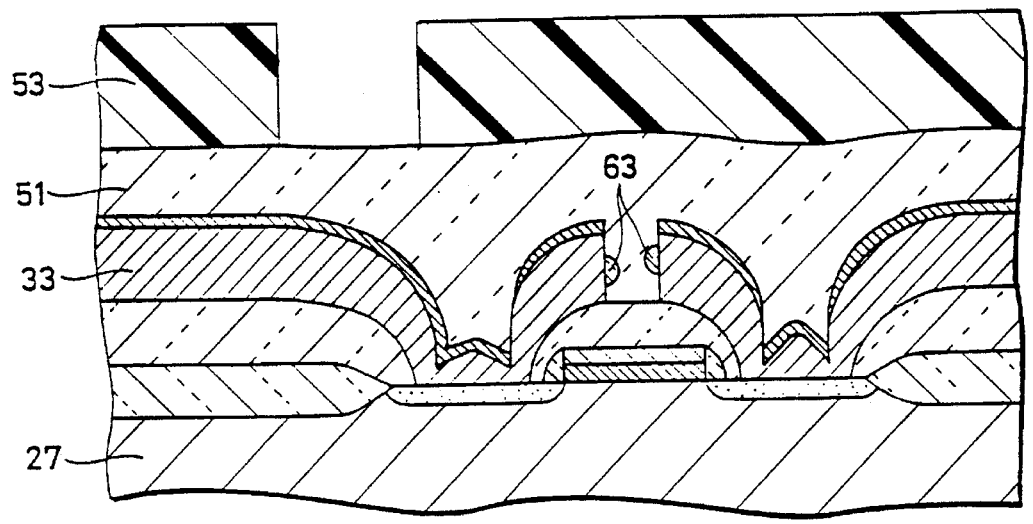
FIG. 18 is a sectional view of a conventional interconnection structure of a semiconductor device showing the second step of the manufacturing steps thereof.
Figure 19:
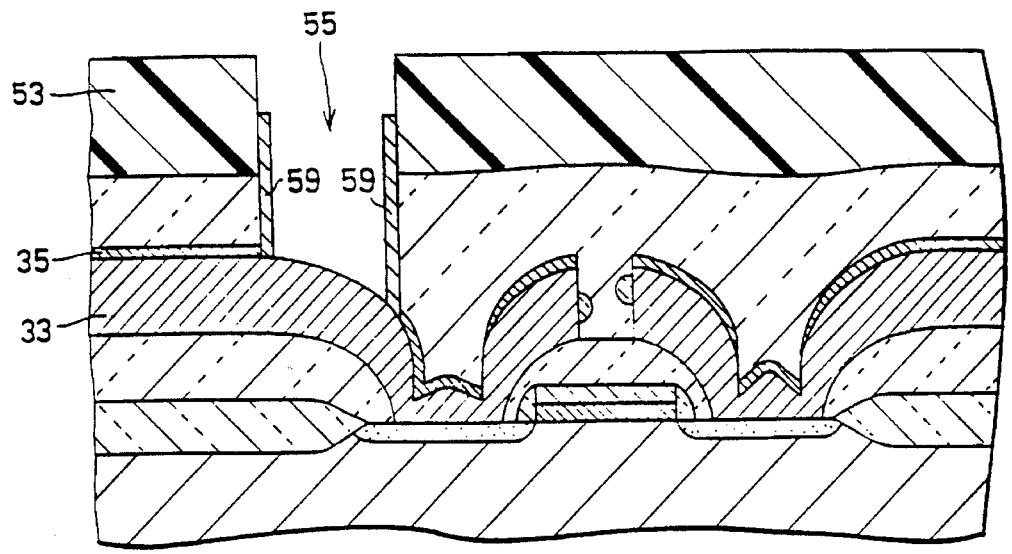
FIG. 19 is a sectional view of a conventional interconnection structure of a semiconductor device showing the third step of the manufacturing steps thereof.
Figure 20:
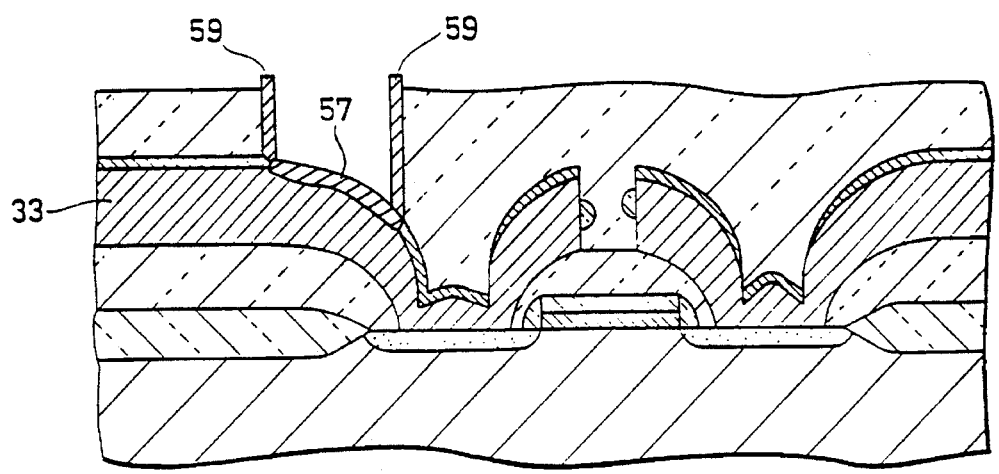
FIG. 20 is a sectional view of a conventional interconnection structure of a semiconductor device showing the fourth step of the manufacturing steps thereof.
Figure 21:
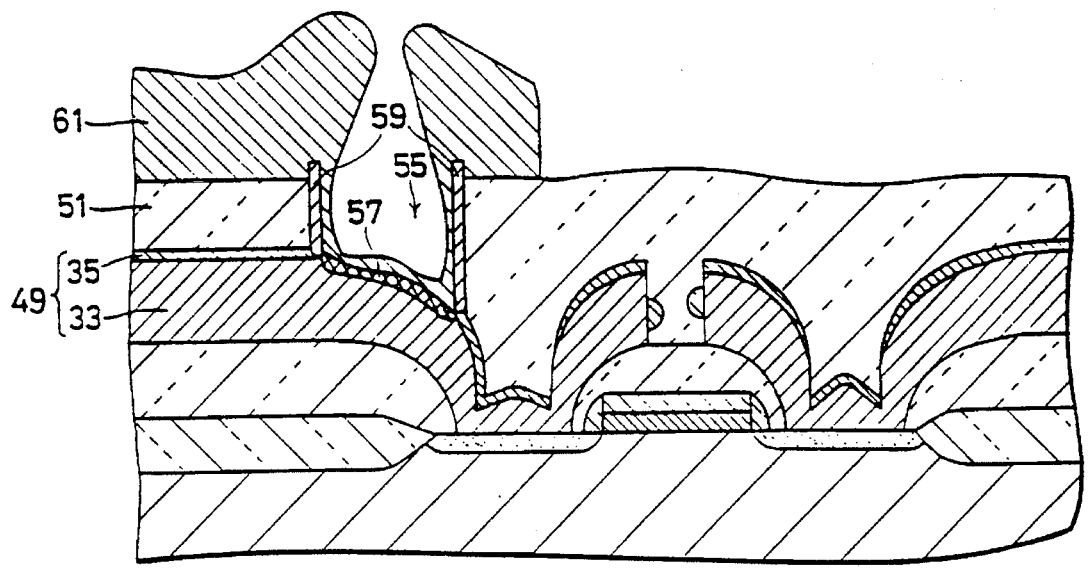
FIG. 21 is a sectional view of a conventional interconnection structure of a semiconductor device showing the fifth step of the manufacturing steps thereof.
Figure 22:
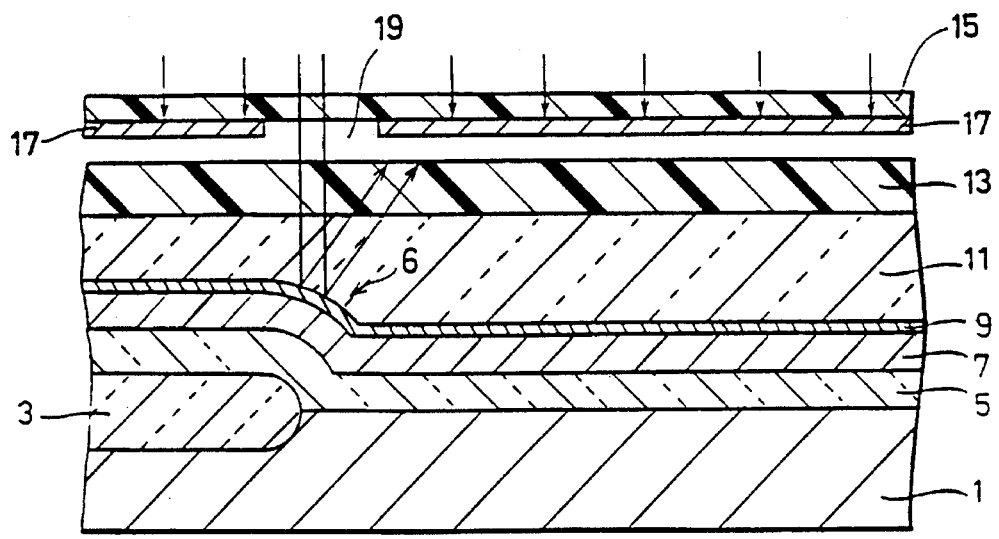
FIG. 22 is a first sectional view of an interconnection structure for explaining problems resulting from reflectance of light by exposure.
Figure 23:
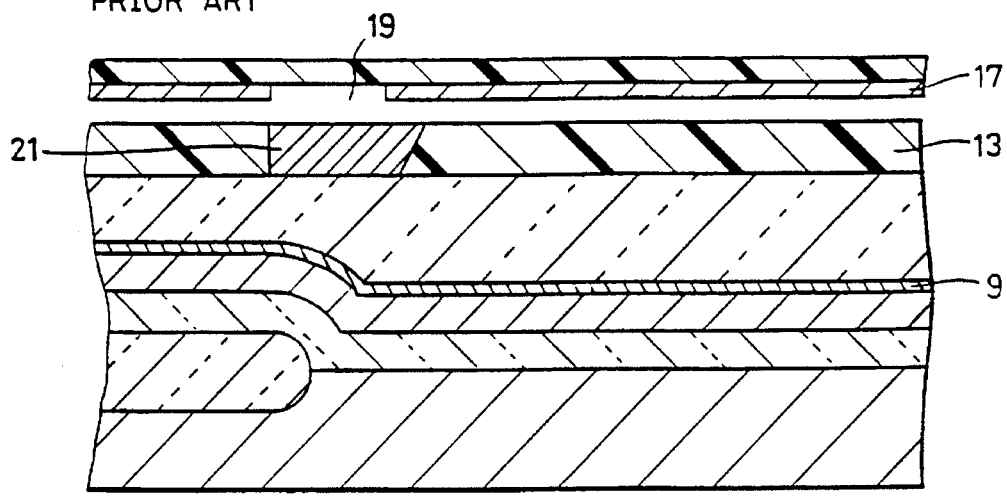
FIG. 23 is a second sectional view of an interconnection structure for explaining problems resulting from reflectance of light by exposure.
Figure 24:
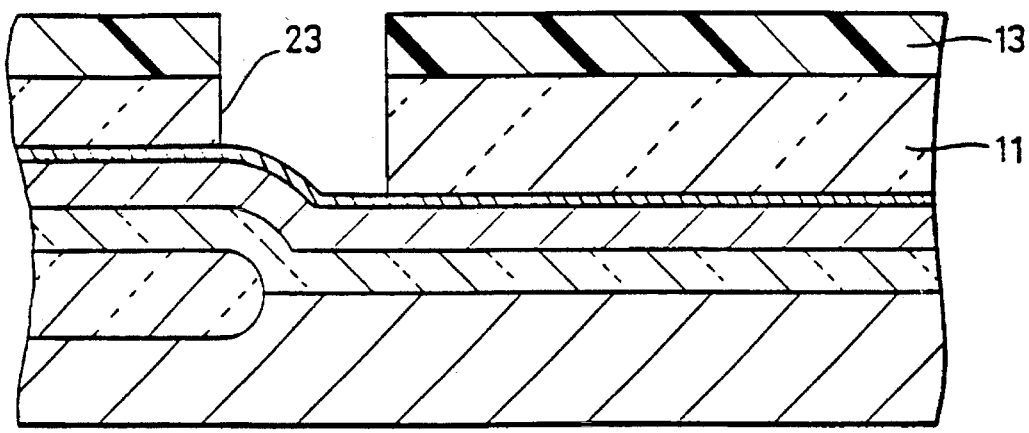
FIG. 24 is a third sectional view of an interconnection structure for explaining problems resulting from reflection of light by exposure.
Figure 25:
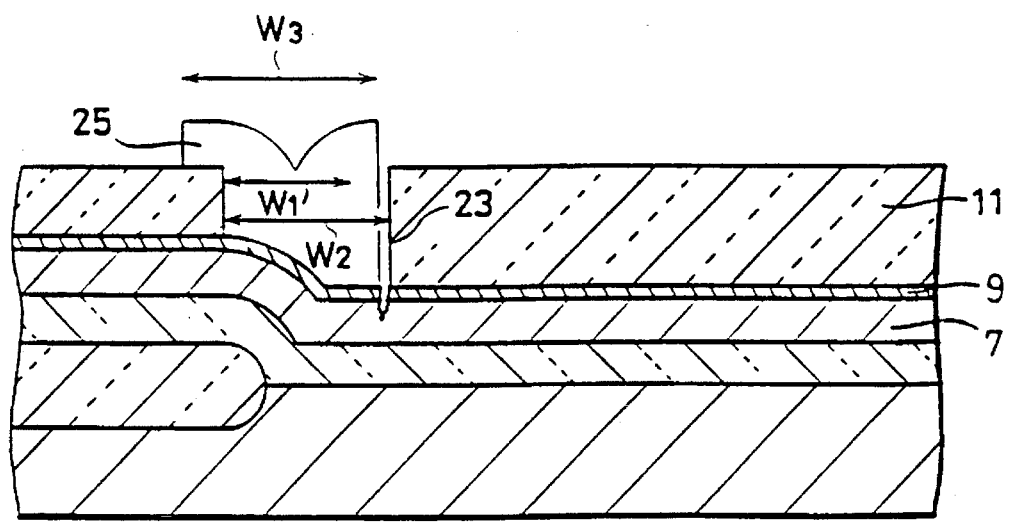
FIG. 25 is a fourth sectional view of an interconnection structure for explaining problems resulting from reflectance of light by exposure.

It can be seen from FIG. 16 that the counted numbers of W is greater in sample 1 than in sample 2 at the etching time of 10–20 minutes. It is therefore understood that W is diffused within Al in sample 1. In other words, W and Al react with each other.

Even if the third conductive layer is etched and removed in forming a through hole, the exposure of the first conductive layer containing metal can be prevented since there is the second conductive layer, in the interconnection structure of the semiconductor device according to the present invention. This eliminates the problem that denatured layers and residues are formed due to exposure of the first conductive layer.

Because the third conductive layer may be etched and removed, it is possible to select a material of low light reflectivity for the third conductive layer. It is also possible to grow the third conductive layer to a thickness in which the light reflectivity is minimum. The problem that the exposed area through the mask is enlarged to expand the dimension of the through hole to be larger than the design value due to high light reflectivity can be avoided.

Separate layers for suppressing the light reflectance and the exposure of the conductivity layer gives easy material selection.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An interconnection structure of a semiconductor device having multilayer interconnection layers connected through a connection hole, comprising:
   a first interconnection layer,
   an insulating layer formed on said first interconnection layer having a through hole reaching the surface of said first interconnection layer, and
   a second interconnection layer formed on said insulating layer, electrically connected to said first interconnection layer by a tungsten plug formed in said through hole,
   wherein said first interconnection layer comprises
      a first conductive layer containing aluminum or an aluminum alloy,
      a second conductive layer formed on said first conductive layer, said second conductive layer comprising a material selected from the group consisting of tungsten, tungsten silicide and molybdenum silicide, and
      a third conductive layer formed on a portion of said second conductive layer and surrounding said tungsten plug, said tungsten plug contacting said second conductive layer,
   wherein said second interconnection layer further comprises a main conductive layer which becomes a main portion of said second interconnection layer and a first titanium nitride containing layer formed on said main conductive layer,
   wherein the etching speed of said second conductive layer is less than that of said third conductive layer under condition of etching said insulating layer with a selected etchant,
   and further wherein light reflectivity of said third conductive layer is less than that of said second conductive layer.

2. The interconnection structure of the semiconductor device according to claim 1, wherein said first interconnection layer comprises a step with said through hole located above said step.

3. The interconnection structure of the semiconductor device according to claim 1, wherein said third conductive layer comprises titanium nitride.

4. The interconnection structure of the semiconductor device according to claim 3, wherein said third conductive layer has a thickness of 300–500 Å.

5. The interconnection structure of the semiconductor device according to claim 1, wherein said second conductive layer comprises tungsten or tungsten silicide, said second conductive layer having a thickness of 500 Å and above.

6. The interconnection structure of the semiconductor device according to claim 1, wherein the etching speed of said second conductive layer is at most 1/10 of that of said insulating layer.

7. The interconnection structure of the semiconductor device according to claim 6, wherein said second conductive layer has a thickness of 1000 Å and below.

8. The interconnection structure of the semiconductor device according to claim 1, wherein said first conductive layer is an aluminum-copper alloy.

9. The interconnection structure of the semiconductor device according to claim 1, including a plurality of said first interconnection layers at first and second depths in said insulating layer,
   wherein said second conductive layer of the first interconnection layer deeper in said insulating layer has a minimum thickness, prior to etching thereof, corresponding to the etching speed of said second conductive layer under condition of etching said insulating layer with an etchant, and the difference between said first and second depths.

10. The interconnection structure of the semiconductor device according to claim 9, wherein said minimum thickness of said second conductive layer is 500 Å.

11. The interconnection structure of the semiconductor device according to claim 1, wherein said second conductive layer has a maximum thickness of 1000 Å.

12. An interconnection structure of a semiconductor device having multilayer interconnection layers connected through a connection hole, comprising:
   a first interconnection layer,
   an insulating layer formed on said first interconnection layer having a through hole reaching the surface of said first interconnection layer, and
   a second interconnection layer formed on said insulating layer, electrically connected to said first interconnection layer through said through hole,
   wherein said first interconnection layer comprises
      a first conductive layer containing aluminum or an aluminum alloy,
      a second conductive layer formed on said first conductive layer, said second conductive layer comprising a material selected from the group consisting of tungsten and tungsten silicide and having a thickness between 500 Å and 1000 Å, and
      a third conductive layer comprising titanium nitride and having a thickness of 300–500 Å formed on said second conductive layer,
   wherein the etching speed of said second conductive layer is less than that of said third conductive layer under condition of etching said insulating layer with a selected etchant,
   wherein light reflectivity of said third conductive layer is less than that of said second conductive layer and further wherein the second interconnection layer is in contact with the second conductive layer at a bottom of the through hole.

13. The interconnection structure of the semiconductor device according to claim 12, wherein said first interconnection layer comprises a step with said through hole located above said step.

14. The interconnection structure of the semiconductor device according to claim 12, wherein the etching speed of said second conductive layer is at most 1/10 of that of said insulating layer.

15. The interconnection structure of the semiconductor device according to claim 12, wherein said second interconnection layer comprises a main conductive layer which becomes a main portion of said second interconnection layer, and a first titanium nitride containing layer formed on said main conductive layer.

16. The interconnection structure of the semiconductor device according to claim 12, wherein said first conductive layer comprises an aluminum-copper alloy.

17. The interconnection structure of the semiconductor device according to claim 12, including a plurality of said first interconnection layers at first and second depths in said insulating layer, wherein said second conductive layer of the first interconnection layer deeper in said insulating layer has a minimum thickness, prior to etching thereof, corresponding to the etching speed of said second conductive layer under condition of etching said insulating layer, and the difference between said first and second depths.

18. An interconnection structure of a semiconductor device having multilayer interconnection layers connected through a connection hole, comprising:

a first interconnection layer, an insulating layer formed on said first interconnection layer having a through hole reaching the surface of said first interconnection layer, and a second interconnection layer formed on said insulating layer, electrically connected to said first interconnection layer through said through hole, wherein said first interconnection layer comprises a first conductive layer containing aluminum or an aluminum alloy, a second conductive layer formed on said first conductive layer, said second conductive layer comprising a layer containing tungsten, and a third conductive layer comprising titanium nitride, wherein the etching speed of said second conductive layer is less than that of said third conductive layer under condition of etching said insulating layer with a selected etchant, and further wherein light reflectivity of said third conductive layer is less than that of said second conductive layer and the second interconnection layer is in contact with the second conductive layer at a bottom of the through hole.

19. The interconnection structure of the semiconductor device according to claim 18, wherein said first interconnection layer comprises a step with said through hole located above said step.

20. The interconnection structure of the semiconductor device according to claim 18, wherein the etching speed of said second conductive layer is at most 1/10 of that of said insulating layer.

21. The interconnection structure of the semiconductor device according to claim 18, wherein said second interconnection layer comprises a main conductive layer which becomes a main portion of said second interconnection layer, and a first titanium nitride containing layer formed on said main conductive layer.

22. The interconnection structure of the semiconductor device according to claim 18, including a plurality of said first interconnection layers at first and second depths in said insulating layer, wherein said second conductive layer of the first interconnection layer deeper in said insulating layer has a minimum thickness, prior to etching thereof, corresponding to the etching speed of said second conductive layer under condition of etching said insulating layer, and the difference between said first and second depths.

\* \* \* \* \*